US007117713B2

(12) United States Patent
Lu

(10) Patent No.: US 7,117,713 B2
(45) Date of Patent: Oct. 10, 2006

(54) TERMINAL CRIMPING MACHINE

(75) Inventor: Frank Lu, Chang Hwa (TW)

(73) Assignee: K.S. Terminals Inc., Chang Hwa (TW)

( * ) Notice: Subject to any disclaimer, the term of this patent is extended or adjusted under 35 U.S.C. 154(b) by 398 days.

(21) Appl. No.: 10/751,227

(22) Filed: Jan. 2, 2004

(65) Prior Publication Data

US 2005/0145006 A1 Jul. 7, 2005

(51) Int. Cl.
*H01R 43/04* (2006.01)
*B21D 37/00* (2006.01)
*H01R 43/055* (2006.01)
*H05K 13/02* (2006.01)

(52) U.S. Cl. ....................... 72/712; 72/409.14; 72/413; 29/566.2; 29/748; 29/753

(58) Field of Classification Search ............... 29/566.2, 29/748, 753, 751, 862, 863, 882; 72/421, 72/409.06, 409.14, 413, 712
See application file for complete search history.

(56) References Cited

U.S. PATENT DOCUMENTS 4,114,253 A * 9/1978 Loomis et al. ............. 29/566.2
4,718,160 A * 1/1988 Bulanda et al. ............ 29/566.2
5,131,124 A * 7/1992 Skotek ......................... 29/748
5,440,799 A * 8/1995 Marshall et al. ........... 29/566.2
5,666,719 A * 9/1997 Bair ............................ 29/753
5,799,391 A * 9/1998 Tillotson ..................... 29/753
5,887,340 A * 3/1999 Bair ............................ 29/751
6,367,148 B1 * 4/2002 Caveney et al. .............. 29/753
6,513,695 B1 * 2/2003 Yamakawa .................. 228/3.1
6,601,290 B1 * 8/2003 Stakem ........................ 29/748

* cited by examiner

*Primary Examiner*—David Jones
(74) *Attorney, Agent, or Firm*—Charles E. Baxley

(57) ABSTRACT

The present invention relates to a terminal crimping machine capable of feeding different sized terminals, which includes a base body provided at a lower end thereof with a feeding platform for placement of terminal-chain; a punching mechanism having an upper crimper and a driving piece, the upper crimper capable of moving longitudinally on the base body; an adjusting mechanism provided with a fixing block and an adjusting screw, the fixing block fixed in the base body and the adjusting screw movably coupled on the fixing block; an auto-feeder having a fixing base disposed on a front side of the base body, and a first and a second driven pieces disposed in the fixing base in an interlocking manner, wherein the second driven piece driven by an elastic force to abut against the adjusting screw of the adjusting mechanism, and the second driven piece provided at an end thereof with a pushing block, the driving piece of the punching mechanism employed to drive the first driven piece, so as to enable the second driven piece to push terminals on the base body.

2 Claims, 10 Drawing Sheets

TERMINAL CRIMPING MACHINE

BACKGROUND OF THE INVENTION

1. Field of the Invention

The present invention relates to a terminal crimping machine, and more particularly to a terminal crimping machine capable of feeding different sized terminals.

2. Description of the Prior Arts

A conventional terminal crimping machine generally comprises a base body, an auto-feeder and a punching mechanism. Wherein the base body is provided at a lower end thereof with a feeding platform for placement of terminal chain. The auto-feeder can be movably disposed on the base body and located close to the feeding platform, so as to push the terminal chain to a crimping position automatically. The punching mechanism can be movably disposed at a position close to an upper end of the base body, so as to carry out crimping operation on the terminals at the crimping position. However, in real operation, there are still some defects need to be improved as follows:

The distances between each pair of neighboring terminals in the terminal chain are the same, and the distance between the neighboring terminals decides the operating distance of the auto-feeder, in other words, the traveling distance of the auto-feeder is fixed. Thereby, a terminal crimping machine only fits terminals of single size. Once the terminal size is changed, the terminal crimping machine is unable to feed the terminal anymore, so the applicability is limited.

The present invention has arisen to mitigate and/or obviate the afore-described disadvantages of the conventional terminal crimping machine.

SUMMARY OF THE INVENTION

The primary object of the present invention is to provide a terminal crimping machine equipped with an adjusting mechanism, which is able to adjust auto-feeder to fit different sized terminals, such that the auto-feeder is capable of feeding different sized terminals.

The terminal crimping machine in accordance with the present invention includes:

a base body is provided at a lower end thereof with a feeding platform for placement of terminal-chain;

a punching mechanism has an upper crimper and a driving piece, the upper crimper capable of moving longitudinally on the base body;

an adjusting mechanism is provided with a fixing block and an adjusting screw, the fixing block is fixed in the base body and the adjusting screw movably coupled on the fixing block;

an auto-feeder has a fixing base disposed on a front side of the base body, and a first and a second driven pieces are disposed in the fixing base in an interlocking manner, wherein the second driven piece is driven by an elastic force to abut against the adjusting screw of the adjusting mechanism, and the second driven piece is provided at an end thereof with a pushing block, the driving piece of the punching mechanism employed to drive the first driven piece, so as to enable the second driven piece to push terminals on the base body;

The present invention will become more obvious from the following description when taken in connection with the accompanying drawings, which shows, for purpose of illustrations only, the preferred embodiment in accordance with the present invention.

DETAILED DESCRIPTION OF THE PREFERRED EMBODIMENT

Figure 1:
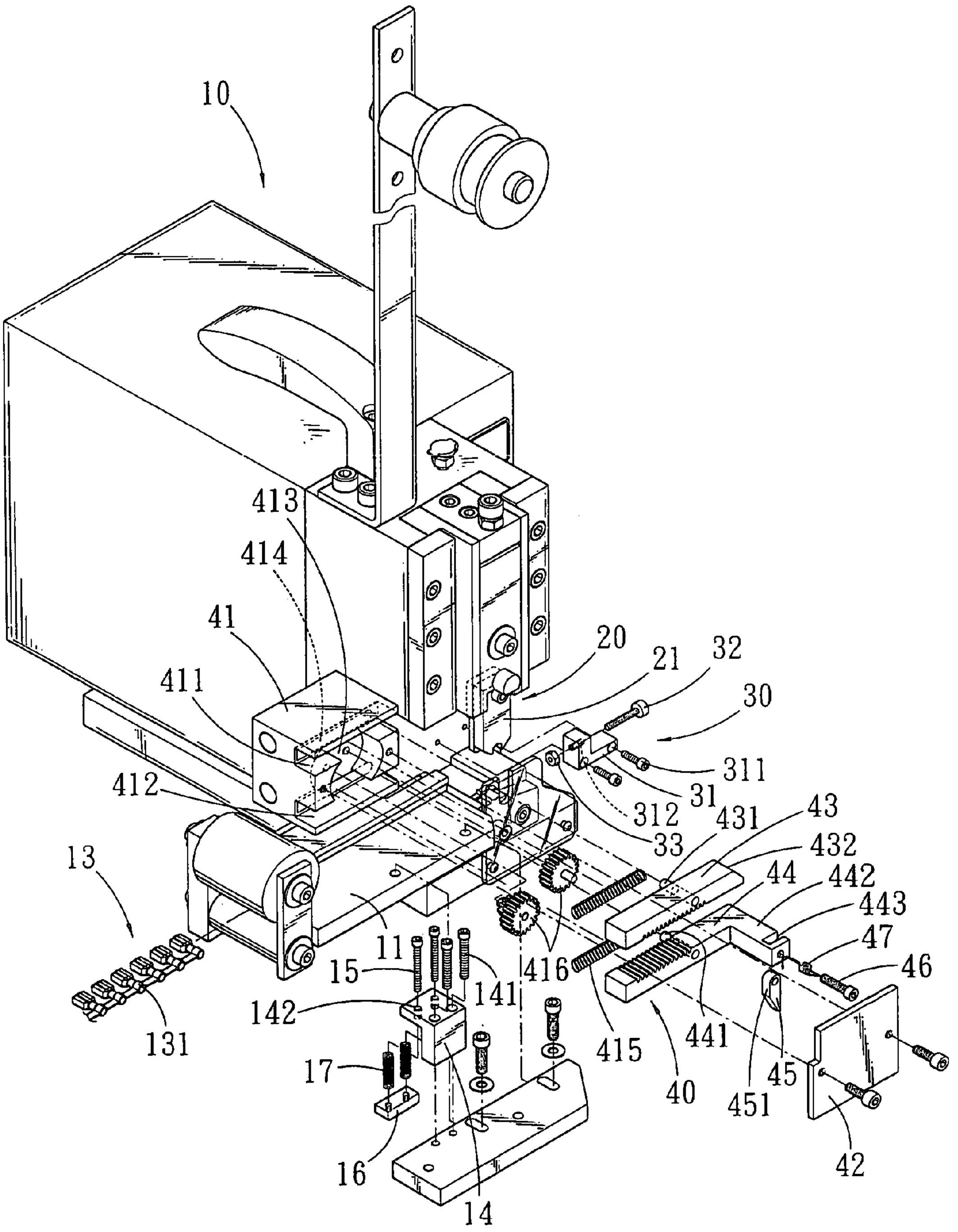
FIG. 1 is an exploded view of a terminal crimping machine in accordance with the present invention.
Figure 2:
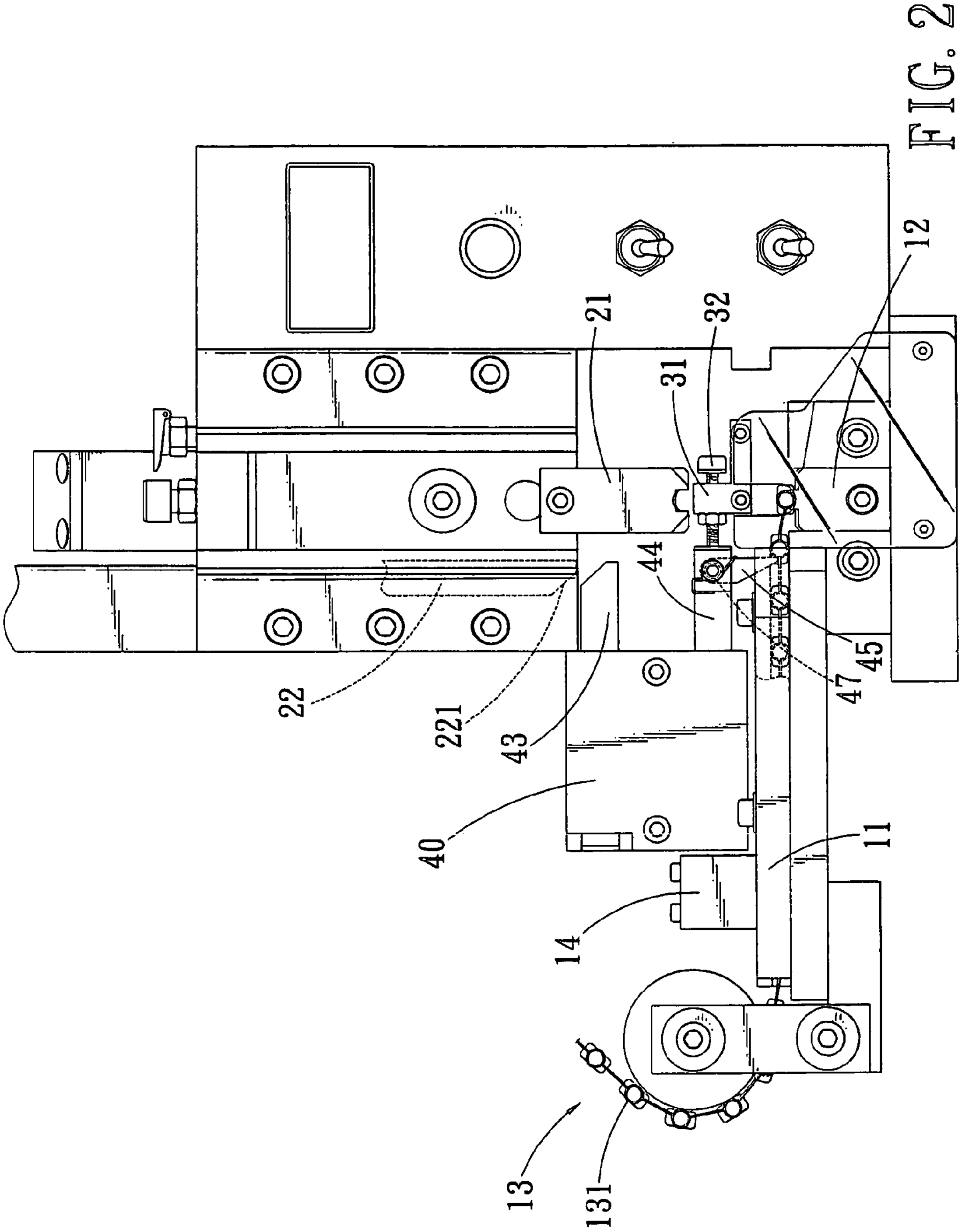
FIG. 2 is a side view of the terminal crimping machine in accordance with the present invention.
Figure 3:
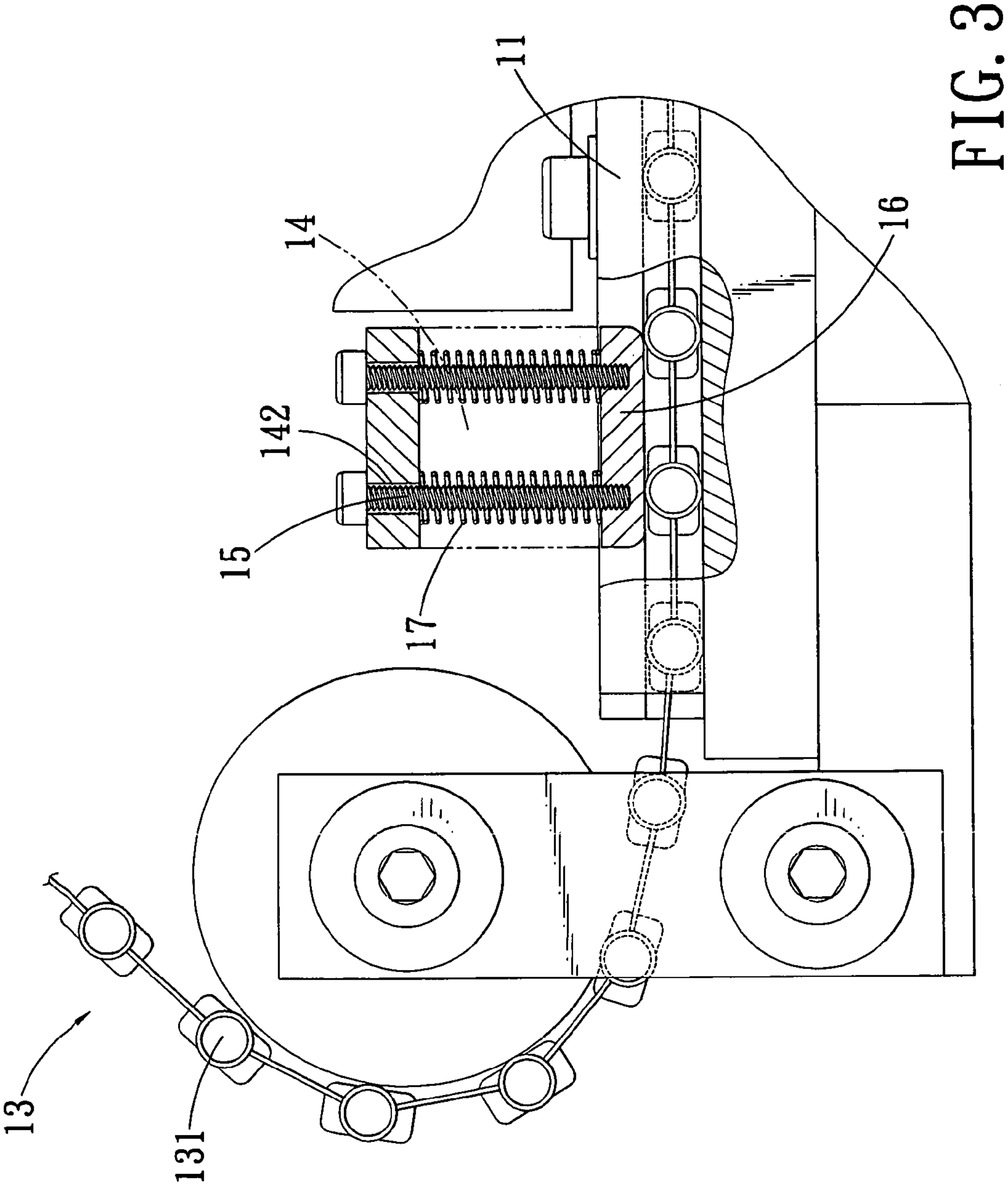
FIG. 3 is an assembly view specially for protrusive block and elastic block of the terminal crimping machine in accordance with the present invention.

Referring to FIGS. 1, 2, 3 and 8, a terminal crimping machine in accordance with a preferred embodiment of the present invention generally comprises a base body 10, a punching mechanism 20, an adjusting mechanism 30 and an auto-feeder 40.

The base body 10 is provided at a lower end thereof with a feeding platform 11, and adjacent to the feeding platform 11 is an anvil 12 defined. Wherein the feeding platform 11 is provided for placement of terminal-chain 13, and a protrusive block 14 is disposed at a feeding inlet of the feeding platform 11 through screw 141. The protrusive block 14 is formed with two through holes 142, in each of which is inserted a screw bolt 15 which has a first end for abutting against an outer periphery of the through holes 142 of the protrusive block 14 and a second end being screwed with an elastic block 16. Furthermore, a spring 17 is mounted onto the screw bolt 15 and located between the elastic block 16 and the protrusive block 14, such that the elastic block 16 is able to move relative to the protrusive block 14 under a pressure, so as to prevent vertical motion of the terminal-chain 13 and enable the terminal-chain 13 to move smoothly.

The punching mechanism 20 is disposed at a front side of the base body 10, which includes an upper crimper 21 and a driving piece 22. The upper crimper 21 and the driving piece 22 move synchronously, and the driving piece 22 is defined with a bevel portion 221 at a lower end thereof, whereas the upper crimper 21 corresponds to the anvil 12 in the longitudinal direction.

The adjusting mechanism 30 includes a fixing block 31 and adjusting screw 32. The fixing block 31 is L-shaped, a long side of which is affixed to a front side of the base body 10 by virtue of screw 311, and a short side of which is defined with an adjusting hole 312. The adjusting screw 32 is movably received in the adjusting hole 312 of the adjusting block 31 and which can be moved along a lateral direction thereof. The adjusting screw 32 is screwed with a locating member 33 at a protrusive end thereof so as to be fixed after adjustment.

The auto-feeder 40 has a fixing base 41 disposed on a front side of the base body 10, a cover 42 fixed to a front side of the fixing base 41, and a first and a second driven pieces 43, 44 disposed in the fixing base 41. Wherein the fixing base 41 is provided with a first and a second grooves 411, 412 along the lateral direction thereof, and a space 413 defined between the first and the second grooves 411, 412. At a bottom of the first and the second grooves 411, 412 is respectively formed with a recess 414 and in which received an elastic element 415, whereas in the space 413 is provided with a gear cluster 416.

The first and the second driven pieces 43, 44 are provided with protrusive bars 431, 441 at a side thereof. And the first and the second driven pieces 43, 44 are received in the first and the second grooves 411, 412 respectively in a manner that the protrusive bars 431, 441 received in the recesses 414 by abutting against an end of the elastic element 415 respectively.

Furthermore, the first and the second driven pieces 43, 44 each has a side surface for meshing with the gear cluster 416, so as to enable the first and the second driven pieces 43, 44 to move synchronously and equidirectionally.

The first driven piece 43 has a bevel portion 432 formed at an end thereof, which corresponds to the bevel portion 221 of the driving piece 22 of the punching mechanism 20, whereas the second driven piece 44 has a coupling portion 442 formed at an end thereof, on the coupling portion 442 a notch 443 is defined, and in notch 443 is received a pushing block 45 with pushing face 451. The pushing block 45 is positioned in the notch 443 of the coupling portion 442 by virtue of a screw rod 46. Furthermore, a torsion spring 47 is mounted onto the screw rod 46 by a first end 471 fastening to an opposite side to a bottom 444 of the notch 443 of the coupling portion 442 and a second end 472 locking to an opposite side to the pushing face 451 of the pushing block 45. The second driven piece 44 abuts against the adjusting screw 32 of the adjusting mechanism 30 under the influence of the torsion spring. The bevel portion 221 of the driving piece 22 is employed to drive that bevel portion 432 of the first driven piece 43, whereas the pushing block 45 of the second driven piece 44 serves to push the terminal-chain on the base body 10.

Figure 4:
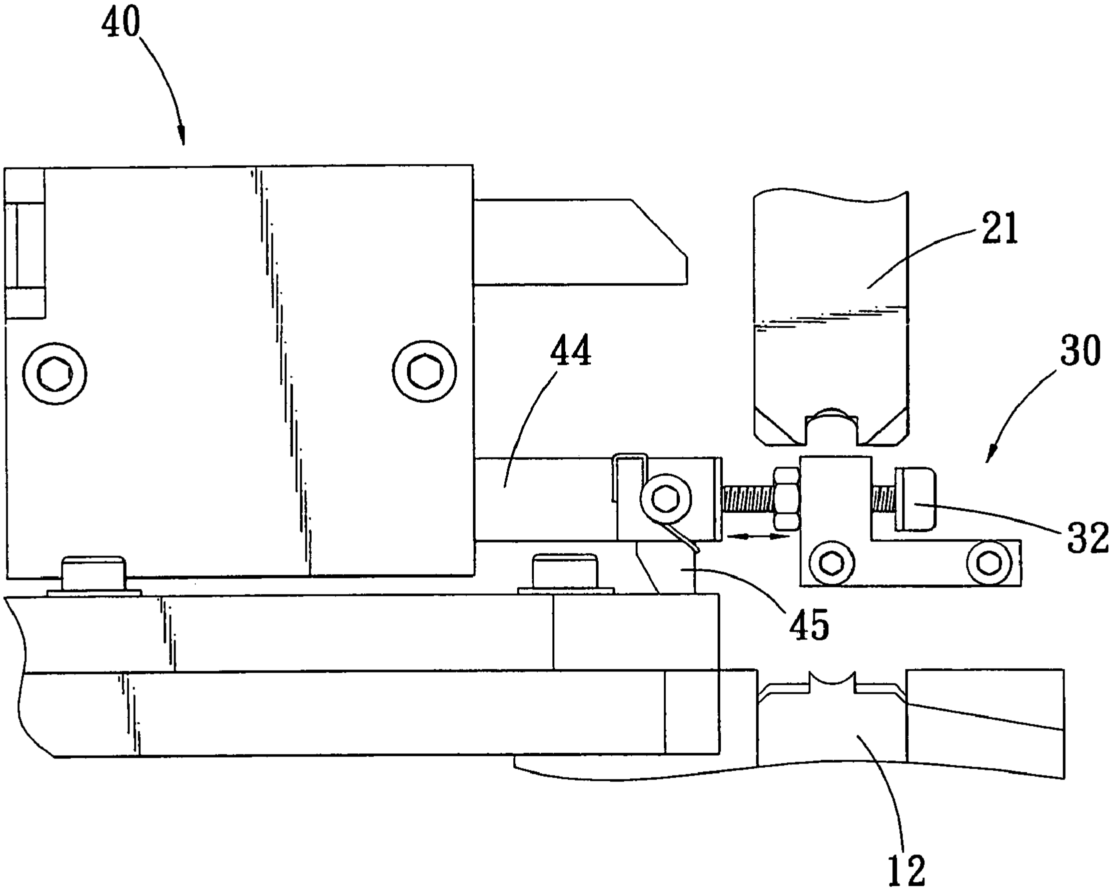
FIG. 4 is an illustrative view showing adjusting mechanism of the terminal crimping machine in accordance with the present invention.
Figure 5:
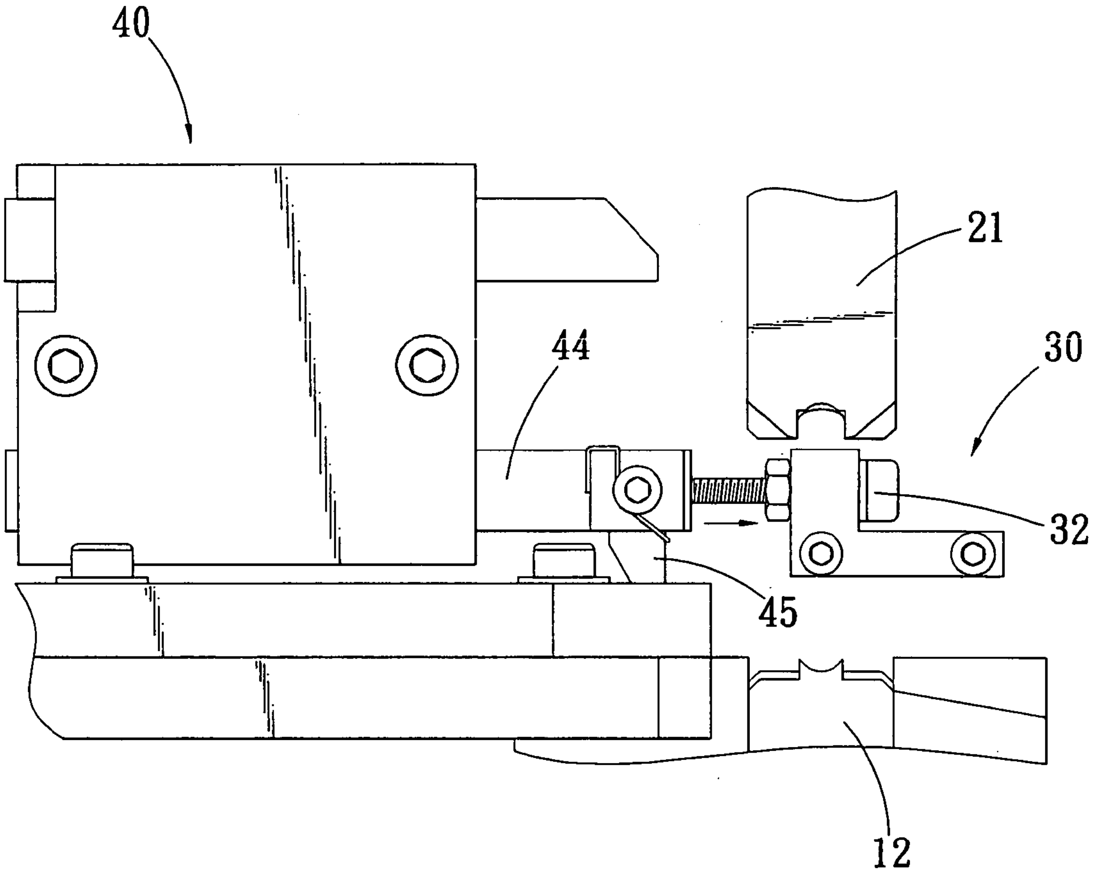
FIG. 5 is another illustrative view showing adjusting mechanism of the terminal crimping machine in accordance with the present invention.

Referring to FIGS. 4 and 5, in crimping operation, by adjusting the adjusting screw 32 of the adjusting mechanism 30, the second driven piece 44 is accordingly adjusted under the influence of spring, so as to adjust a distance between the pushing block 45 of the second driven piece 44 and the upper crimper 21 to fit the terminal-chain. Thereby, the auto-feeder 40 is able to feed terminals to a crimping position (namely, the position between the upper crimper 21 and the anvil 12). In this way, by adjusting the adjusting mechanism 30, the crimping machine of the present invention can be applicable to different sized terminals.

Figure 6:
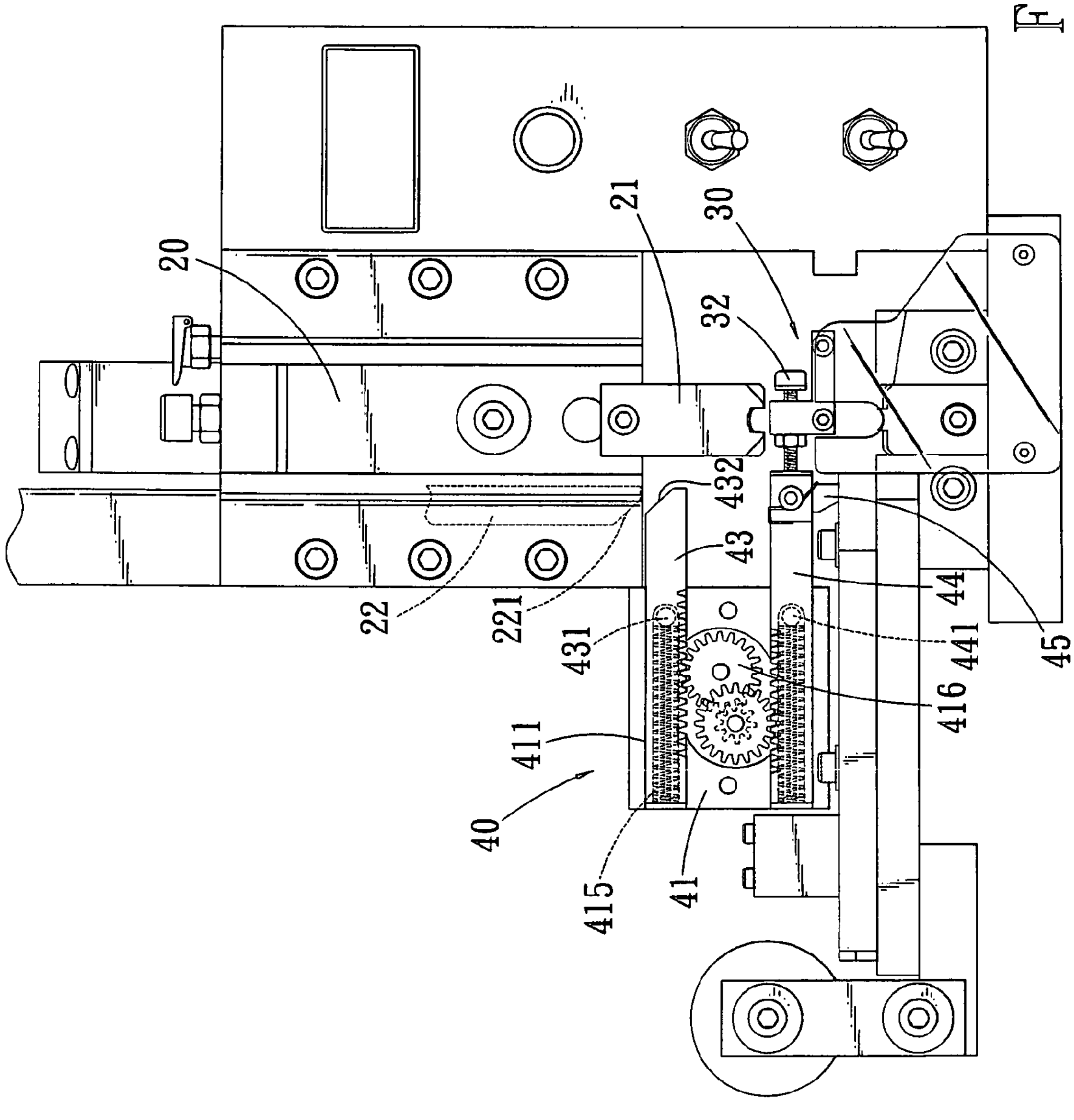
FIG. 6 is an operational view showing the terminal crimping machine before crimping operation in accordance with the present invention.
Figure 7:
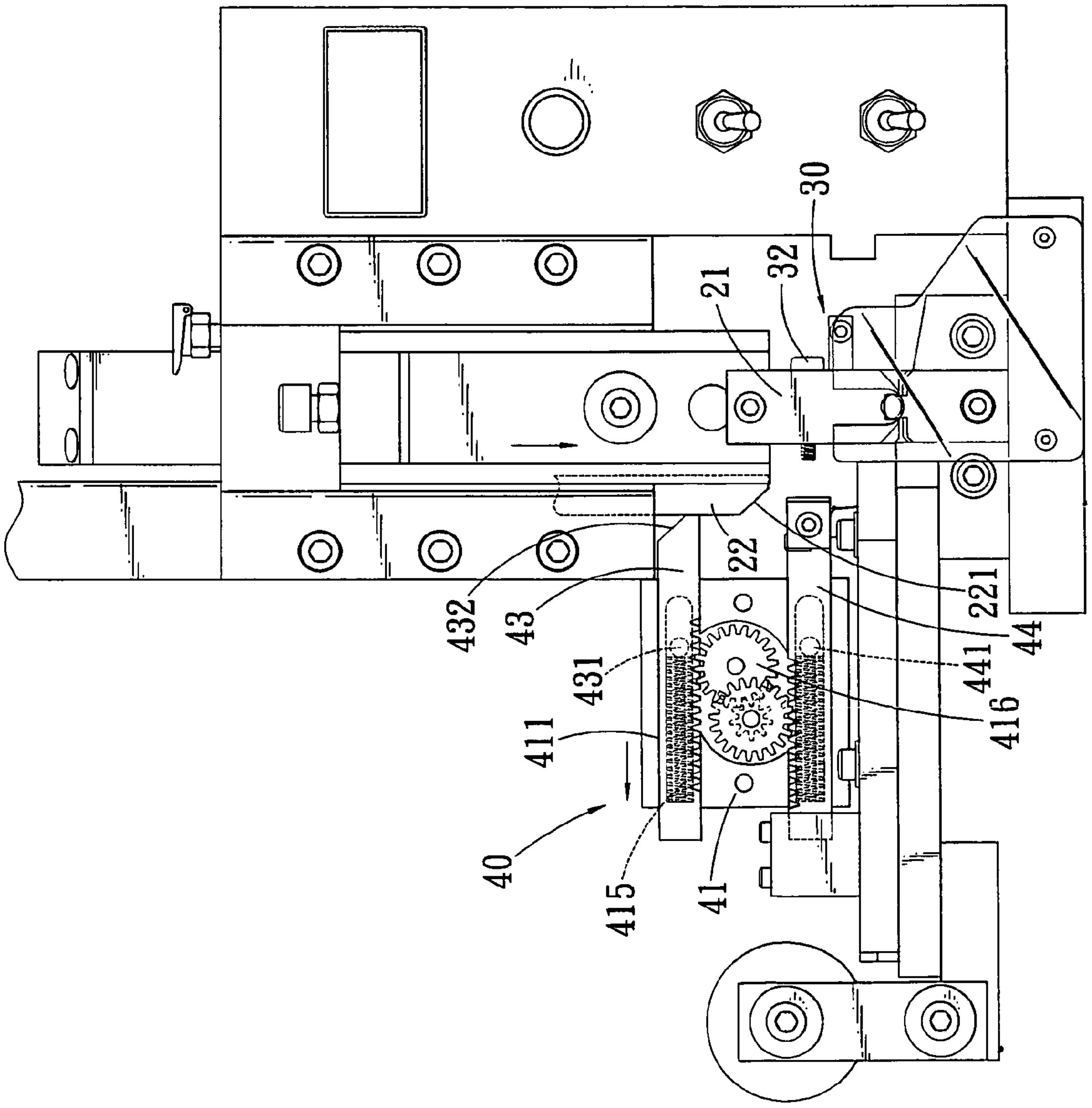
FIG. 7 is an operational view showing the terminal crimping machine after crimping operation in accordance with the present invention.

Referring to FIGS. 6 and 7, when the punching machine 20 is controlled to move downward, the bevel portion 221 of the driving piece 22 of the punching mechanism 20 be caused to push the bevel portion 432 of the first driven piece 43 of the auto-feeder 40, which further causes a lateral motion of the first driven piece 43 in the first groove 411. Since the first driven piece 43 meshes with the gear cluster 416 and the gear cluster 416 meshes with the second driven piece 44, the first and the second driven pieces 43, 44 move synchronously and equidirectionally, so as to make the pushing block 45 on the second driven piece 44 stride over the terminals to be crimped. At this moment, the first and the second driven pieces 43, 44 abut against the end of the elastic element 415 with the protrusive bars 431, 441, and the elastic element 415 is compressed, thereby the driving piece 22 will not push the bevel portion 432 of the first driven piece 43 with its bevel portion 221 after the upper crimper 21 of the punching mechanism 20 finished its crimping operation and moves upward. When the first and the second driven pieces 43, 44 return to its original position with the help of the elastic element 415 (the second driven piece 44 abuts against the adjusting screw 32 of the adjusting mechanism 30), while the second driven piece 44, after it returned to its original position, will push the terminals to be crimped to the crimping position for next turn crimping operation.

Figure 8:
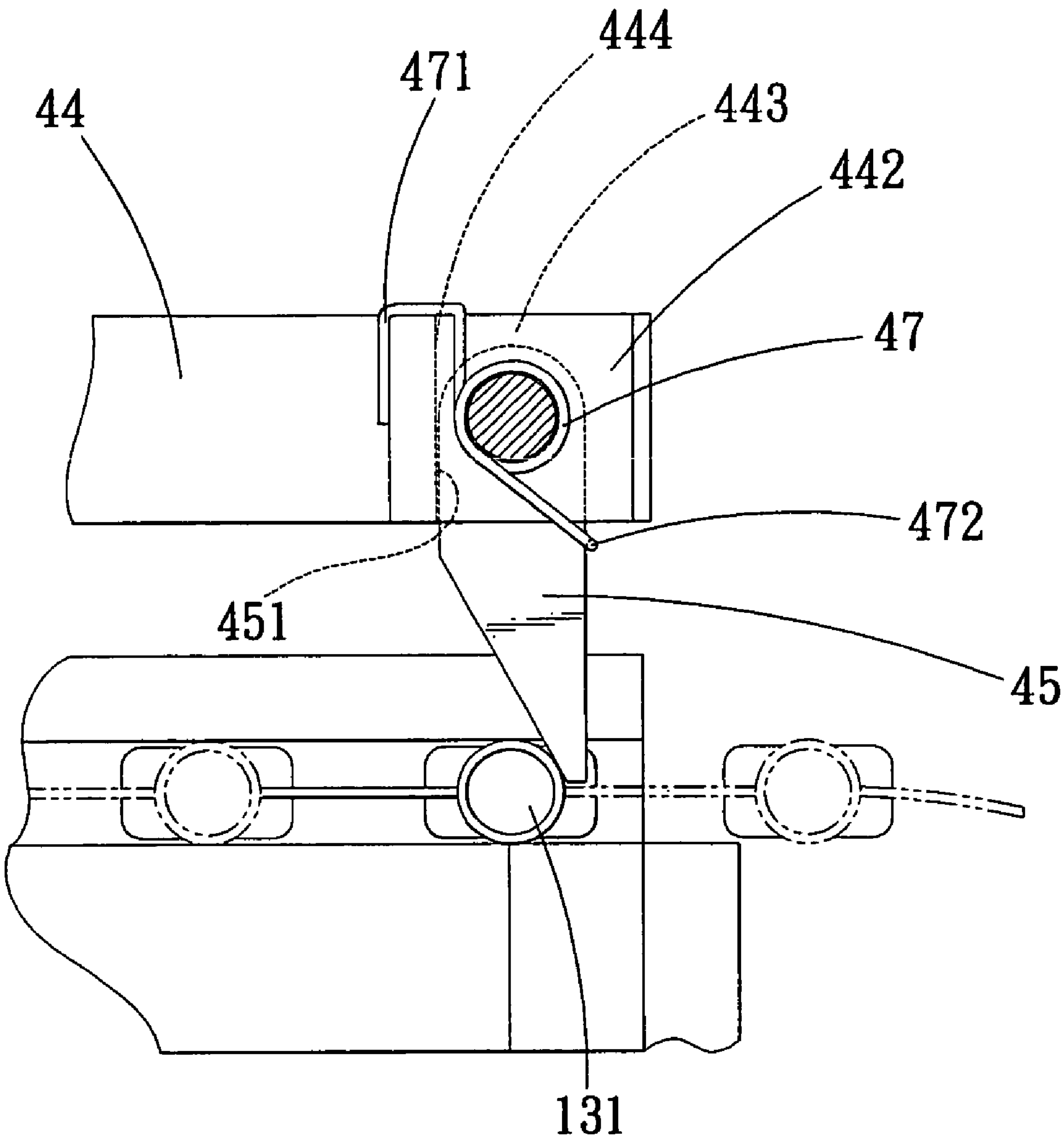
FIG. 8 is an operational view in accordance with the present invention of showing pushing block pushing the terminals.
Figure 9:
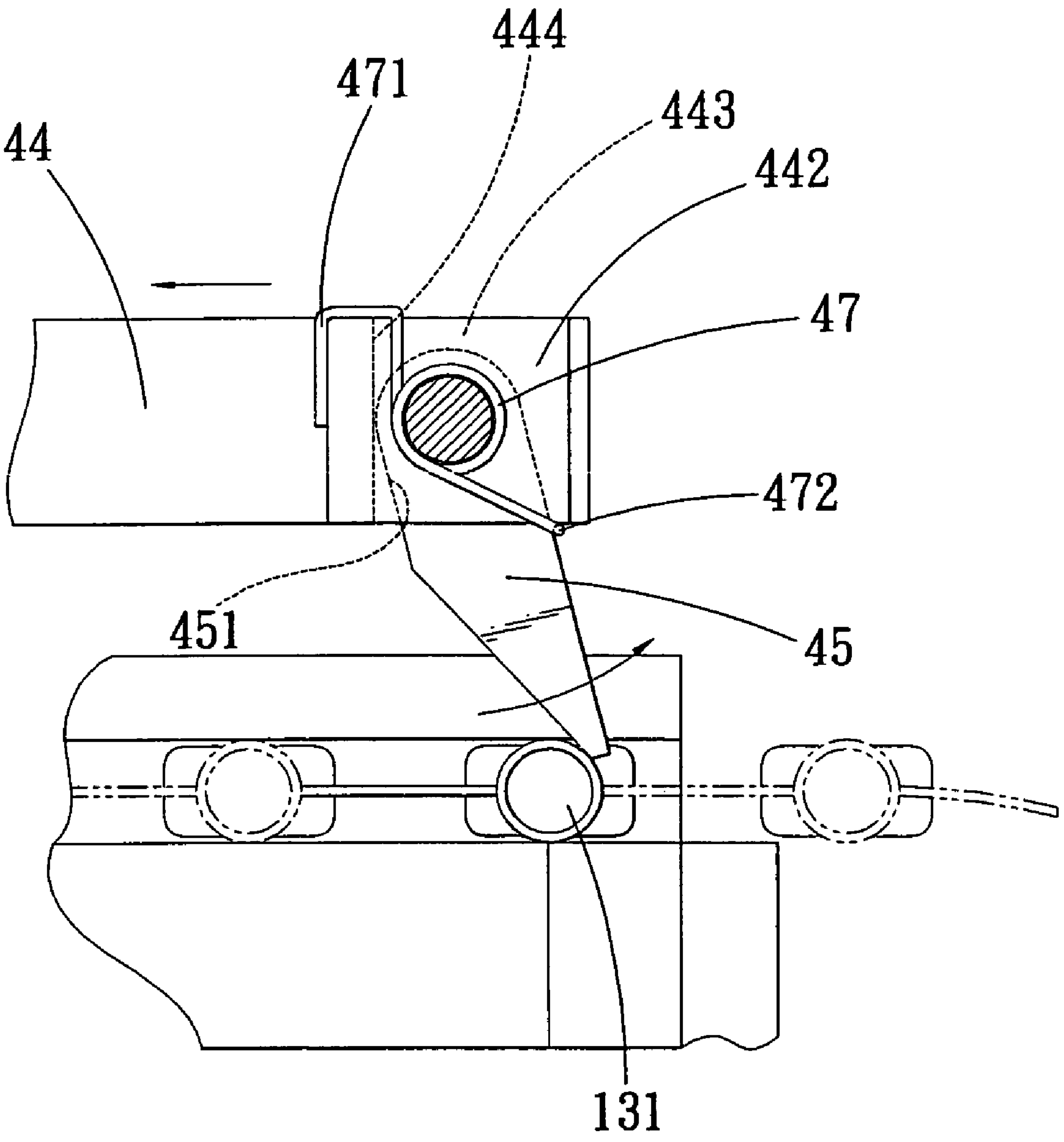
FIG. 9 is another operational view in accordance with the present invention of showing pushing block pushing the terminals.
Figure 10:
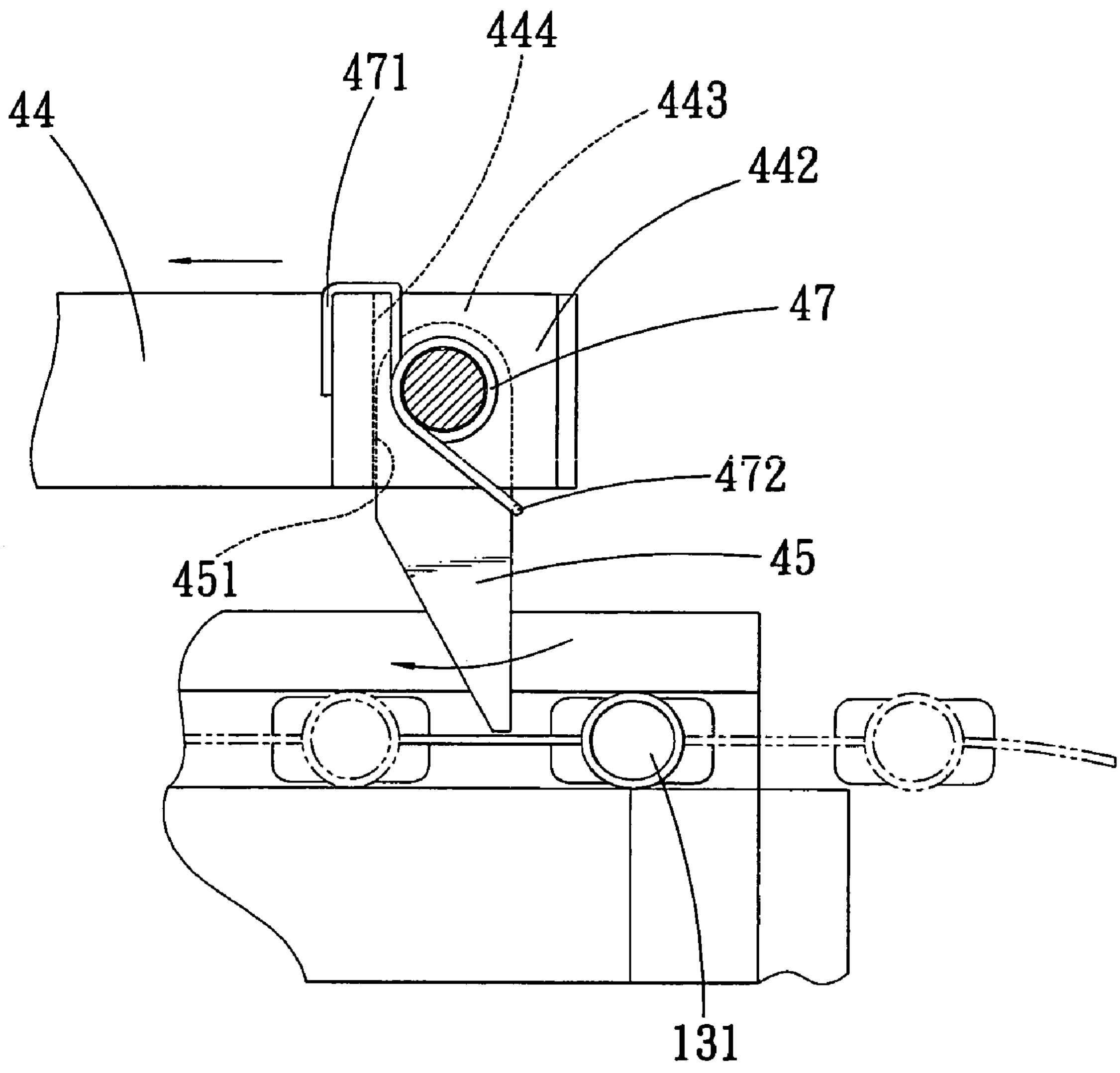
FIG. 10 is another operational view in accordance with the present invention of showing pushing block pushing the terminals.

Referring to FIGS. 8–10, in case of a lateral motion of the second driven piece 44, the pushing block 45 will touch the to-be-crimped terminal 131, and since it is located in the notch 443 of the coupling portion 442 of the second driven piece 44, the pushing block 45 moves counterclockwise due to being stopped by the to-be-crimped terminal 131. In the meantime, since the torsion spring 47 has the first end 471 fastened to the opposite side to the bottom 444 of the notch 443 of the coupling portion 442, and the second end 472 locked to the opposite side to the pushing face 451 of the pushing block 45, the pushing block 45 deforms the torsion spring 47 after movement, and it won't return clockwise to the original position until striding over the terminal 131. After crimping operation is finished, the second driven piece 44 pushes the pushing block 45 toward the crimping position. Due to the pushing face 451 of the pushing block 45 corresponds to the bottom 444 of the notch 443 of the second driven piece 44, when the pushing block 45 pushes the terminal 131 forward, the pushing block 45 won't move clockwise cause being stopped by the bottom 444 of the notch 443, and thus it can push the terminal 131 smoothly to the crimping position.

While we have shown and described various embodiments in accordance with the present invention, it should be clear to those skilled in the art that further embodiments may be made without departing from the scope of the present invention.

What is claimed is:

1. A terminal crimping machine, comprising:

a base body provided at a lower end thereof with a feeding platform for placing terminal-chain thereon;

a punching mechanism having an upper crimper and a driving piece;

an adjusting mechanism provided with a fixing block and an adjusting screw, the fixing block fixed on the base body and the adjusting screw adjustably disposed on the fixing block;

an auto-feeder having a fixing base disposed on a front side of the base body, and a first driven piece and a second driven piece disposed in the fixing base in an interlocking manner, wherein the second driven piece is driven by an elastic force of an elastic element to abut against the adjusting screw of the adjusting mechanism, and the second driven piece is provided at an end thereof with a pushing block, the driving piece of the punching mechanism is employed to drive the first driven piece, so as to enable the second driven piece to push terminals on the base body;

in crimping operation, by adjusting the adjusting screw of the adjusting mechanism, a distance between the pushing block of the second driven piece and the upper crimper can be adjusted to fit different sized terminals, enabling the auto feeder to push the different sized terminals to a crimping position for crimping operation;

a protrusive block is provided on the feeding platform, an elastic block is formed on the protrusive block for enabling terminals to be conveyed smoothly;

the fixing base of the auto-feeder is provided with a first groove and a second groove in a lateral direction thereof, and a space is defined between the first and the second grooves, a recess is formed in a bottom of the first and the second grooves, respectively, for reception of the elastic element, the first and the second driven pieces are provided with protrusive bars at a side thereof, and the first and the second driven pieces are received in the first and the second grooves respectively in a manner that the protrusive bars abut against an end of the elastic element, a gear cluster is disposed in the space of the fixing base for meshing with the first and the second driven pieces, so that the first and the second driven pieces can move synchronously.

2. The terminal crimping machine as claimed in claim 1, wherein the pushing block is positioned in a notch of the coupling portion by virtue of a screw rod, a torsion spring is mounted onto the screw rod in a manner that the torsion spring has a first end fastened to the coupling portion and a second end affixed to the pushing block.

* * * * *